(12) United States Patent
Kats et al.

(10) Patent No.: US 8,188,413 B2
(45) Date of Patent: May 29, 2012

(54) TERRESTRIAL CONCENTRATOR SOLAR TRACKING PHOTOVOLTAIC ARRAY

(75) Inventors: Mikhail Kats, Rockaway, NJ (US); Travis Dodd, Albuquerque, NM (US); James Sherman, Hillsborough, NJ (US); Peter Allen Zawadzki, Clinton, NJ (US); Gary Hering, Belle Mead, NJ (US)

(73) Assignee: Emcore Solar Power, Inc., Albuquerque, NM (US)

( * ) Notice: Subject to any disclaimer, the term of this patent is extended or adjusted under 35 U.S.C. 154(b) by 588 days.

(21) Appl. No.: 12/257,670

(22) Filed: Oct. 24, 2008

(65) Prior Publication Data
US 2010/0102200 A1 Apr. 29, 2010

(51) Int. Cl.
*G01C 21/02* (2006.01)
*F24J 2/38* (2006.01)
*H01L 31/042* (2006.01)

(52) U.S. Cl. .................. 250/203.4; 126/576; 136/246
(58) Field of Classification Search ............... 250/203.4; 136/246, 251, 259; 126/576, 684
See application file for complete search history.

(56) References Cited

U.S. PATENT DOCUMENTS

| | | |
|---|---|---|
| 4,031,385 A | 6/1977 | Zerlaut et al. |
| 4,172,739 A | 10/1979 | Tassen |
| 4,345,582 A | 8/1982 | Aharon |
| 4,425,904 A | 1/1984 | Butler |
| 4,440,465 A | 4/1984 | Elliott et al. |
| 4,585,318 A | 4/1986 | Seifert |
| 4,586,488 A | 5/1986 | Noto |
| 4,628,142 A | 12/1986 | Hashizume |
| 4,832,001 A | 5/1989 | Baer |
| 4,888,340 A | 12/1989 | Neh et al. |
| 4,989,124 A | 1/1991 | Shappell |
| 4,995,377 A | 2/1991 | Eiden |
| 5,169,456 A | 12/1992 | Johnson |
| 5,600,124 A | 2/1997 | Berger |
| 5,798,517 A | 8/1998 | Berger |
| 6,058,930 A | 5/2000 | Shingleton |
| 6,079,408 A | 6/2000 | Fukuda |
| 6,123,067 A | 9/2000 | Warrick |
| 6,465,725 B1 | 10/2002 | Shibata et al. |
| 6,552,257 B1 | 4/2003 | Hart et al. |

(Continued)

FOREIGN PATENT DOCUMENTS

DE 10 2004 018 151 10/2005

(Continued)

OTHER PUBLICATIONS

"Concentrating PV module and system developers." Photon International: The Photovoltaic Magazine. Aug. 2009. pp. 134-137, Photon Europe GmbH, Aachen, Germany.

(Continued)

*Primary Examiner* — Georgia Y Epps
*Assistant Examiner* — Don Williams (57) ABSTRACT

A terrestrial concentrator solar tracking photovoltaic array that may include an elongated frame configured to mount concentrator solar cell modules in a longitudinally-extending and spaced-apart arrangement. The frame is able to rotate each of the concentrator solar cell modules along a first axis to simultaneously track the elevation of the sun during the course of a day. The frame is also able to rotate each concentrator solar cell array module along second axes that are substantially perpendicular to the first axis to track the azimuthal position of the sun during the course of the day.

18 Claims, 6 Drawing Sheets

U.S. PATENT DOCUMENTS

| | | | |
|---|---|---|---|
| 6,563,040 | B2 | 5/2003 | Hayden et al. |
| 6,722,357 | B2 | 4/2004 | Shingleton |
| 6,960,717 | B2 | 11/2005 | Stuart et al. |
| 7,252,084 | B2 | 8/2007 | Pawlenko et al. |
| 7,381,886 | B1 | 6/2008 | Aiken et al. |
| 7,795,568 | B2 | 9/2010 | Sherman |
| 2004/0112373 | A1 | 6/2004 | Djeu |
| 2007/0089777 | A1 | 4/2007 | Johnson, Jr. et al. |
| 2007/0101738 | A1 | 5/2007 | Akei et al. |
| 2007/0188876 | A1 | 8/2007 | Hines et al. |
| 2007/0193620 | A1 | 8/2007 | Hines et al. |
| 2008/0128586 | A1 | 6/2008 | Johnson et al. |
| 2008/0135087 | A1 | 6/2008 | Anikara |
| 2008/0178867 | A1 | 7/2008 | DiDomenico |
| 2008/0236567 | A1* | 10/2008 | Hayden ........................ 126/569 |
| 2008/0258051 | A1 | 10/2008 | Heredia et al. |
| 2009/0000662 | A1 | 1/2009 | Harwood et al. |
| 2009/0032014 | A1 | 2/2009 | Meydbray |
| 2009/0032084 | A1 | 2/2009 | Aiken et al. |
| 2009/0032086 | A1 | 2/2009 | Kats et al. |
| 2009/0032090 | A1* | 2/2009 | Kats et al. ..................... 136/251 |
| 2010/0011565 | A1 | 1/2010 | Zawadzki et al. |
| 2010/0018570 | A1 | 1/2010 | Cashion et al. |
| 2010/0032004 | A1 | 2/2010 | Baker et al. |
| 2010/0101625 | A1 | 4/2010 | Kats et al. |
| 2010/0101630 | A1 | 4/2010 | Kats et al. |
| 2010/0101632 | A1 | 4/2010 | Kats et al. |
| 2010/0102202 | A1 | 4/2010 | Sherman |
| 2010/0108860 | A1 | 5/2010 | Sherman et al. |
| 2010/0258110 | A1* | 10/2010 | Krabbe et al. ................. 126/605 |
| 2010/0294337 | A1 | 11/2010 | Sherman et al. |

FOREIGN PATENT DOCUMENTS

| | | |
|---|---|---|
| DE | 20 2006 003 476 | 12/2006 |
| ES | 2 268 938 | 3/2007 |
| JP | 2000196127 | 7/2000 |
| JP | 2000223730 | 8/2000 |
| JP | 2002202817 | 7/2002 |
| WO | WO 01/55651 | 8/2001 |
| WO | WO 02079793 | 10/2002 |
| WO | 2008/008023 A1 | 1/2008 |
| WO | WO 2008/090241 | 7/2008 |
| WO | WO 2008/154945 | 12/2008 |
| WO | WO 2009/048879 | 4/2009 |

OTHER PUBLICATIONS

"WS T 1600—the world wide connected solar tracker." Data Sheet, 2 pages. www.ws-energia.com. WS Energia Lda, Oeiras, Portugal.
"WS T 1600—the world wide connected solar tracker." Data Sheet, 3 pages. www.ws-energia.com. WS Energia Lda, Oeiras, Portugal.
"WS T1000." Data Sheet, 2 pages. www.ws-energia.com. WS Energia Lda, Oeiras, Portugal.
"170 Watt NE-170UC1." Data Sheet, 2 pages. Sharp.co.jp. Sharp Electronics Corp., Huntington Beach, CA.
"OPEL SF-4M Roof Top Tracker." Data Sheet, 2 pages. www.opelinc.com. OPEL Solar Inc. Shelton, CT.
"FEiNA SF-4 Mini Tracker." Data Sheet, 2 pages. www.opelinc.com. OPEL Solar Inc. Shelton, CT.
"SF-40 H1 Rooftop Tracker." Data Sheet, 2 pages. www.opelinc.com. OPEL Solar Inc. Shelton, CT.
"OPEL TF-800 Single Axis Tracker." Data Sheet, 2 pages. www.opelinc.com. OPEL Solar Inc. Shelton, CT.
"FEiNA SF-9 Dual Axis Tracker." Data Sheet, 2 pages. www.opelinc.com. OPEL Solar Inc. Shelton, CT.
"FEiNA SF-20 Dual Axis Tracker." Data Sheet, 2 pages. www.opelinc.com. OPEL Solar Inc. Shelton, CT.
"OPEL SF-20 CPV Dual Axis Tracker." Data Sheet, 2 pages. www.opelinc.com. OPEL Solar Inc. Shelton, CT.
"TF-500 Dual Axis Tracker." Data Sheet, 2 pages. www.opelinc.com. OPEL Solar Inc. Shelton, CT.
"Mk-Id High Concentration Photovoltaic Panel (HCPV)." Data Sheet, 2 pages. www.opelinc.com. OPEL Solar Inc. Shelton, CT.
"PS140 Solar Concentrator." Data Sheet, 2 pages. www.power-spar.com. Power-Spar, Markham, Ontario, Canada.
Fraas, L., et al., "Start-Up of First 100 kW System in Shanghai with 3-Sun PV Mirror Modules." 4 pages. Presented at 4th International Conference on Solar Concentrators for the Generation of Electricity or Hydrogen (ICSC-4), San Lorenzo del Escorial, Spain, Mar. 12-16, 2007. Jxcrystals.com. JX Crystals, Inc., Issaquah, WA.
Fraas, L., et al., "Test Sites and Testing of 3-Sun Mirror Modules." 4 pages. Presented at IEE 4th World Conference on Photovoltaic Energy Conversion, Waikoloa, Hawaii, May 9, 2006. Jxcrystals.com. JX Crystals, Inc., Issaquah, WA.
"SunCube Specifications." Data Sheet, 4 pages. www.greenandgoldenergy.com.au. Green and Gold Energy Pty. Ltd., Glynde, Australia.
"Sunflower Fully-Integrated, Smart HCPV." Data Sheet, 2 pages. www.energyinnovations.com. Energy Innovations, Poway, CA.
Luque, A. and Hegedus, S., eds. Handbook of Photovoltaic Science and Engineering. Wiley: Hoboken, NJ. 2003. Sections 9.8 and 9.9 and Chapter 11. 64 pages total. ISBN 1591247748. Ebook accessed through North Carolina State University Libraries. http://catalog.lib.ncsu.edu/web2/tramp2.exe/goto/A1hl1rqj.002?screen=Record.html&server=1home&item=3.
Picture of GE Concentrator Array, Circa 1983, Sandia.
U.S. Appl. No. 12/791,580, filed Jun. 1, 2010, Kats et al.
U.S. Appl. No. 12/828,734, filed Jul. 1, 2010, Kozin.
U.S. Appl. No. 12/830,926, filed Jul. 6, 2010, Sherman.
"Kinematics slewing drives" Product description. 1 page. www.kinematicsmfg.com/Products/slewing-drives.aspx. Kinematics Manufacturing, Inc. Phoenix, AZ.
"Slewing Drives S7b-73m-32ra." Data Sheet, 2 pages. www.kinematicsmfg.com/Products/slewing-drives/SlewingDrivesProducts/Slewing-Drives-S7B-73M-32RA.aspx. Kinematics Manufacturing, Inc. Phoenix, AZ.
"Laser welding of plastics. Innovative and flexible." Brochure. http://www.leister.com/uploads/pdf/en/leister_laser_eng.pdf. Sep. 2007. Leister Process Technologies. Kaegiswil, Switzerland. (12 pages).
"GLOBO-welding. Laser welding of plastics—innovative and flexible. The universal processing concept for 3D and continuous applications." Brochure. http://www.leister.com/uploads/pdf/en/BRO_GLOBO_Welding_dv092006_ENG.pdf. Sep. 2006. Leister Process Technologies. Kaegiswil, Switzerland. (4 pages).
"Shop SABRE, a N.A.C.S.I Company. 'The Way CNC Was Meant to Be.'" Laser Product Information. http://www.shopsabre.com/Laser%20Page.html. No date of web publication given. Shop SABRE. Elko, Minnesota, USA. (4 pages).

* cited by examiner

TERRESTRIAL CONCENTRATOR SOLAR TRACKING PHOTOVOLTAIC ARRAY

BACKGROUND

The present application is directed to a terrestrial solar tracking photovoltaic array and, more particularly, to a modular array with solar cell modules that are simultaneously movable about first and second orthogonal axes to maintain the solar cell modules aligned with the sun.

Terrestrial solar tracking photovoltaic arrays are used for various applications. The arrays are designed for a specific output capacity and cannot be modified in a convenient manner for different capacities. The set capacity of the arrays may vary from being relatively small, such as a few kilowatts, to relatively large in excess of hundreds of kilowatts. The arrays may be installed at various locations that have exposure to the sun for adequate periods of time to produce the required power capacity.

The photovoltaic arrays generally include a frame with one or more solar cell modules in the form of panels. The frame may be adjustable to position the solar cell modules towards the sun. The frame may adjust the position of the solar cell modules throughout the day to ensure they remain directed to the sun to maximize the power capacity.

Many existing photovoltaic arrays include large frames that support the solar cell modules. The size of the frames and installation requirements often result in their costs being substantial. Initially, the frames are moved by large trucks or other like equipment to the installation site. Cranes or other like lifting equipment are necessary to lift the frames from the trucks and position them at the correct location. This installation process often requires a large workforce due to the extensive moving and assembly requirements of mounting the frame and attaching the associated solar cell modules. These prior designs did not allow for a single person or just a few persons to install the frame and solar cell modules.

These prior frames also provide for mounting a predetermined number of solar cell modules. There was no ability to modify the number of solar cell modules to accommodate the specific needs of the array. Particularly, there is no manner of modifying the design out in the field during or after the installation.

SUMMARY

The present application is directed to a terrestrial solar tracking photovoltaic array. The array may include a modular design that is sized and weighted to facilitate installation with a small amount of manpower. The array further is adapted to be adjusted during or after installation to accommodate the necessary power requirements.

The present application includes a terrestrial solar tracking photovoltaic array with a longitudinal support extending over the surface of the earth substantially in a north-south direction and including a longitudinally-extending string of spaced apart planar solar cell modules mounted thereon. The longitudinal support is journalled for rotation so as to allow the modules to simultaneously track the elevation of the sun during the course of a day. A pivotable coupling may be located between each of the modules and the longitudinal support so as to allow each module to simultaneously rotate along an axis substantially orthogonal to the longitudinal axis of said longitudinal support and track the azimuthal position of the sun during the course of the day.

The application also includes a terrestrial concentrator photovoltaic solar cell array for producing energy from the sun. The array uses a plurality of sun-tracking concentrator solar cell modules each comprising a substantially planar solar cell subarray including a plurality of triple junction III-V compound semiconductor solar cell receivers. The solar cell modules are arranged substantially linearly along the longest dimension of a central rotating axle that is secured to a surface of the earth by one or more supports. The supports are arranged to orient the longest dimension of the central rotating axle approximately in the north to south direction. The central rotating axle is also adapted to rotate the modules about a first axis substantially parallel to the surface of the earth and defined by the longest dimension of the central rotating axle. The array may include rotatable mounts each of which attaches a respective group of modules to the central rotating axle and allows rotation of the group about a respective second axis substantially perpendicular to the first axis. The array may also include a control system to control rotation of the modules about the first axis to track the azimuth of the sun and to control rotation of the modules about the respective second axes to track the elevation of the sun. The control system is arranged to control rotation of the modules about the first and second axes so that the solar cell modules are maintained substantially orthogonal to incoming rays from the sun.

The various aspects of the various embodiments may be used alone or in any combination, as is desired.

DETAILED DESCRIPTION

Figure 1:
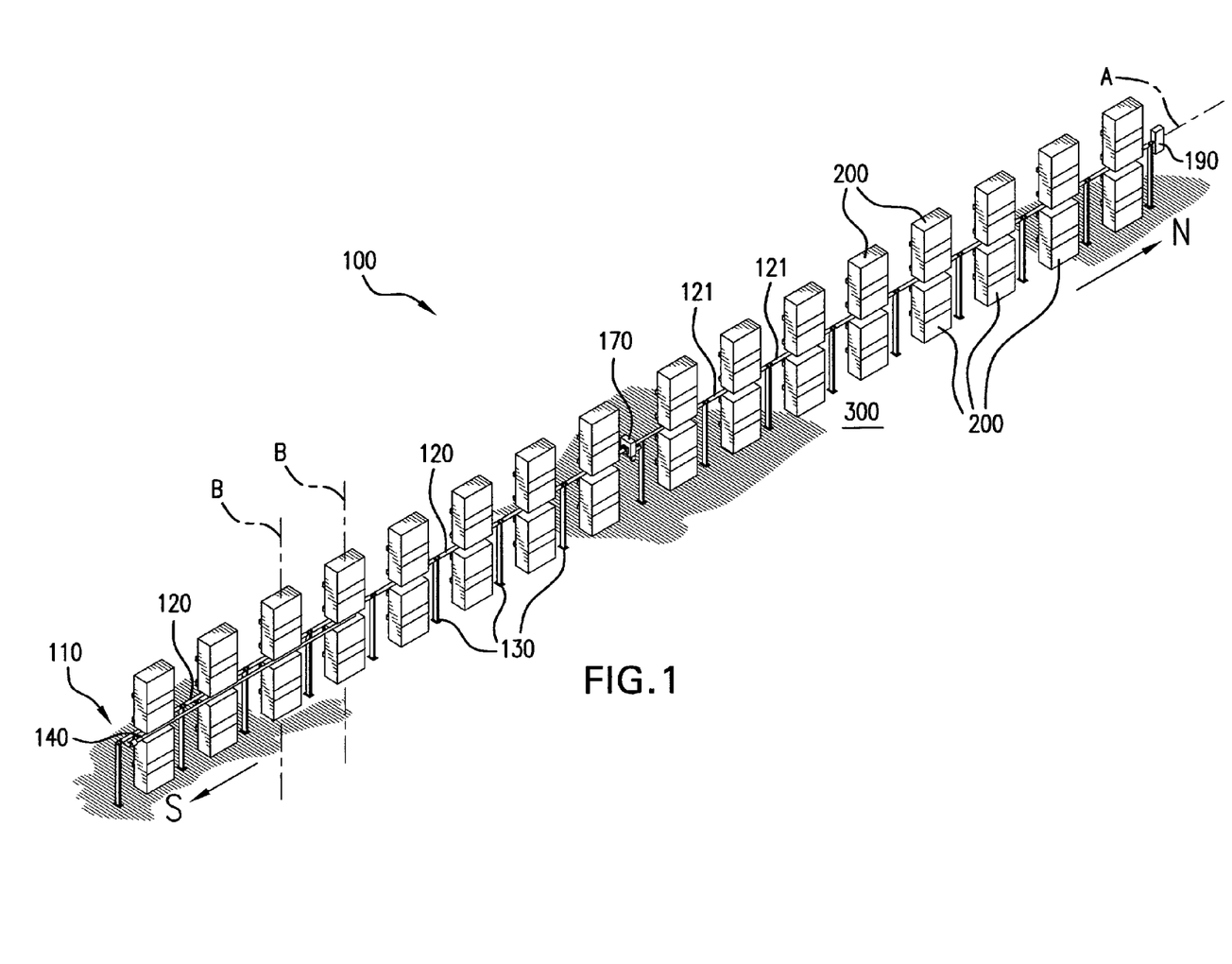
FIG. 1 is a perspective view of a terrestrial solar tracking photovoltaic array according to one embodiment.

The present application is directed to a terrestrial solar tracking photovoltaic array. FIG. 1 illustrates an embodiment of an array generally illustrated as element 100. The array 100 includes an elongated frame 110 configured to mount solar cell modules 200 in a longitudinally-extending and spaced-apart arrangement. The frame 110 is able to rotate each of the solar cell modules 200 along a first axis A to simultaneously track the elevation of the sun during the course of a day. The frame 110 is able to rotate each solar cell module 200 along axes B that are substantially perpendicular to axis A to track the azimuthal position of the sun during the course of the day.

Frame 110 positions the solar cell modules 200 to track the movement of the sun. Frame 110 includes a longitudinal support 120 that is positioned above a surface 300 by spaced-apart vertical supports 130. In one embodiment, the longitudinal support 120 is a single continuous piece. In one specific embodiment, the longitudinal support 120 is a pipe with a diameter of about 4 inches and includes a thickness of about 0.167 inches. The pipe includes a length of about 192" and weighs about 110 lbs.

In another embodiment, the longitudinal support 120 may be constructed from a number of discrete sections 121 that are connected together in an end-to-end arrangement. The lengths and construction of each section 121 may be the same or may be different. In one embodiment, each section 121 is sized to mount a pair of solar cell array modules 200. The modular design provides for a user to construct the longitudinal support 120 to a length needed to support a necessary number of solar cell modules 200. Sections 121 may be added to an existing array 100 to accommodate additional solar cell modules 200 as is necessary for the array 100 to produce the desired power output.

Figure 2A:
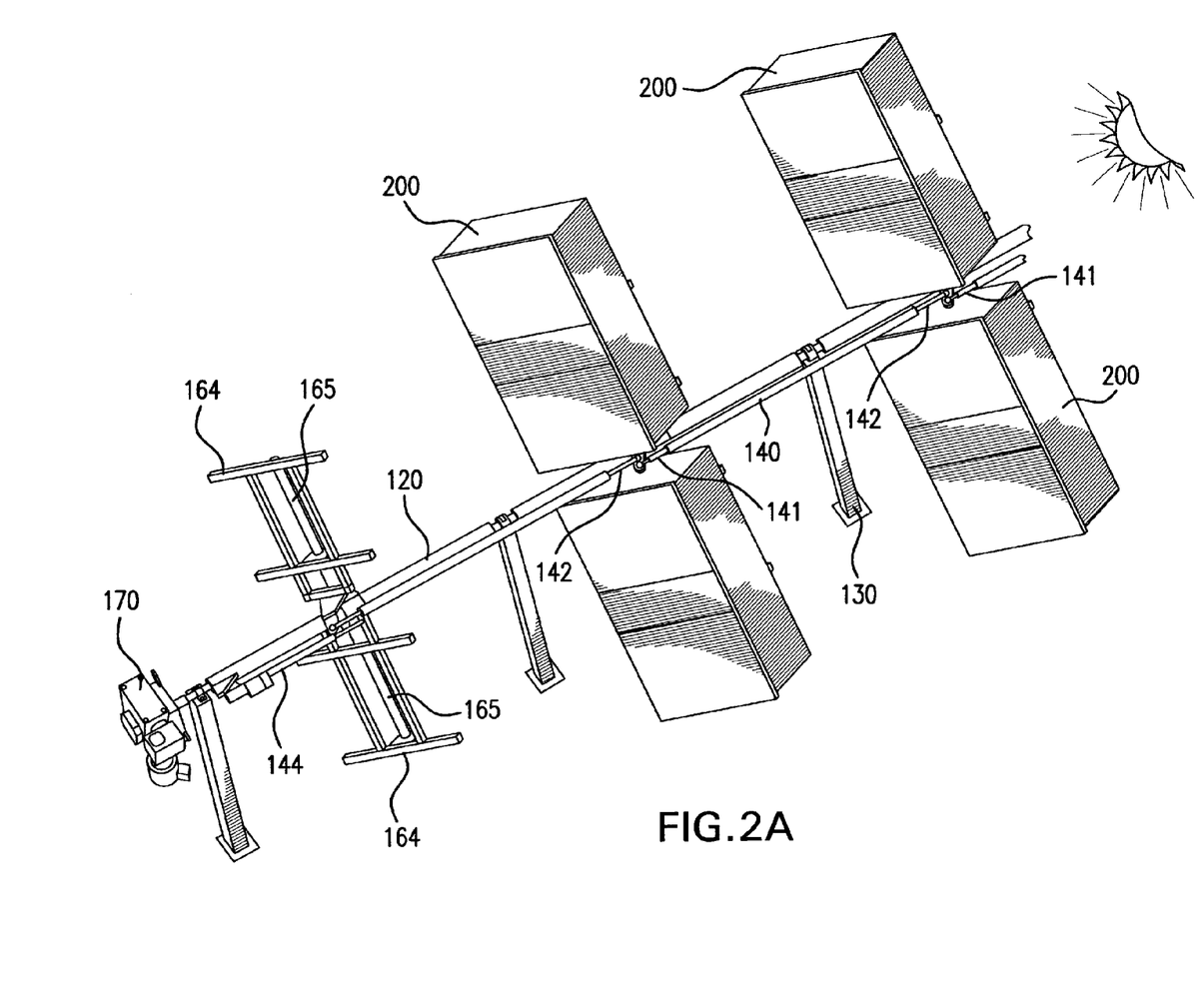
FIG. 2A is a perspective view of a mount and solar cell modules connected to a longitudinal support according to one embodiment.
Figure 3:
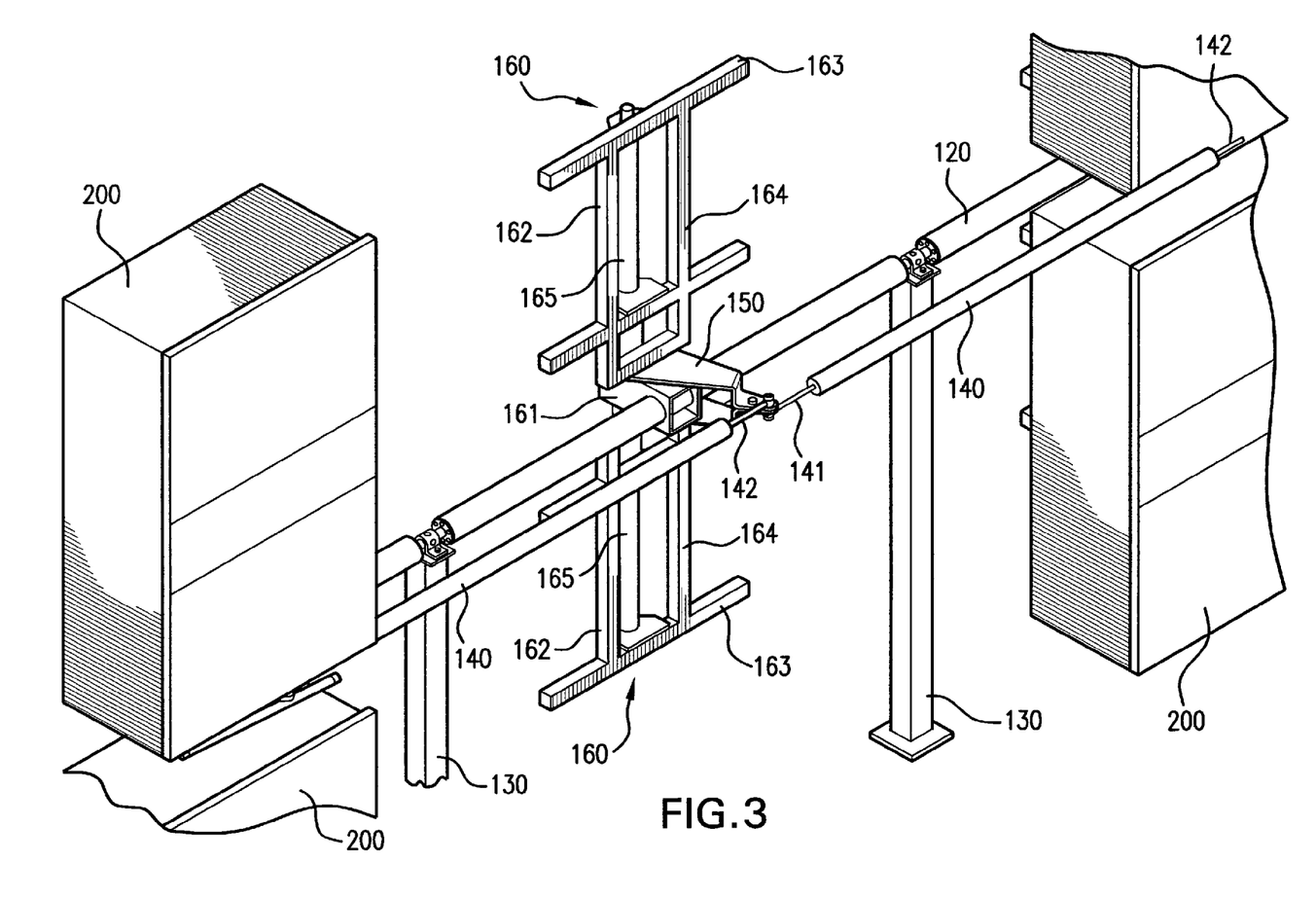
FIG. 3 is a perspective view of a mount connected to a longitudinal support according to one embodiment.

Mounts 160 are connected to the longitudinal support 120 to support the solar cell modules 200. Mounts 160 may include a base 161 that is connected to the longitudinal support 120 as illustrated in FIGS. 2A and 3. A pair of platforms 164 extends outward from the base 161 and is each sized to receive a solar cell module 200. The platforms 164 may include vertical members 162 and horizontal members 163 that support the solar cell modules 200. The platforms 164 extend outward from opposing sides of the base 161 and are positioned on opposing sides of the longitudinal support 120. Mounts 160 may also include different numbers of platforms 164, and may position the platforms 164 at various locations relative to the base 161 and longitudinal support 120. In one specific embodiment, mount 160 includes a single platform 164.

Mounts 160 may also include a pivot member 165 that is connected to the platforms 164. The pivot member 165 facilitates pivoting motion of the solar cell modules 200 about second axes B as will be explained in detail below. Pivot member 165 may extend through the base 161, or may be located away from the base 161.

The vertical supports 130 are spaced apart along the length of the longitudinal support 120. The vertical supports 130 include a length adequate to position the solar cell modules 120 above the surface 300 for rotation about the first axis A. Therefore, the vertical supports 130 are longer than a height of the platforms 164 and the solar cell modules 200.

The vertical supports 130 are positioned along the longitudinal support 120 away from the mounts 160 to prevent interference with the movement of the solar cell modules 200. As illustrated in FIG. 1, the vertical supports 130 are spaced-apart from the solar cell modules 200 along the length of the longitudinal support 120. In this arrangement, the vertical supports 130 are in a non-overlapping arrangement with the solar cell modules 120. Various numbers of vertical supports 130 may be positioned along the length of the longitudinal support 120. In the embodiment of FIG. 1, a vertical support 130 is positioned between each mount 160. In other embodiments, the vertical supports 130 are spaced a greater distance apart along the longitudinal support 120. In one specific embodiment, the vertical supports 130 include a 4 inch by 4 inch rectangular shape, and include a thickness of about 0.188 inches. The vertical supports 130 may also be supported in a concrete pad.

A motor 170 is connected to the longitudinal support 120 to provide a force to rotate the longitudinal support 120 about axis A. In one embodiment, motor 170 may be positioned at an end of the longitudinal support 120. Motor 170 may include one or more gears that engage with the longitudinal support 120. Additional motors 170 may be connected along the length of the longitudinal support 120 to provide additional rotational force.

Figure 4:
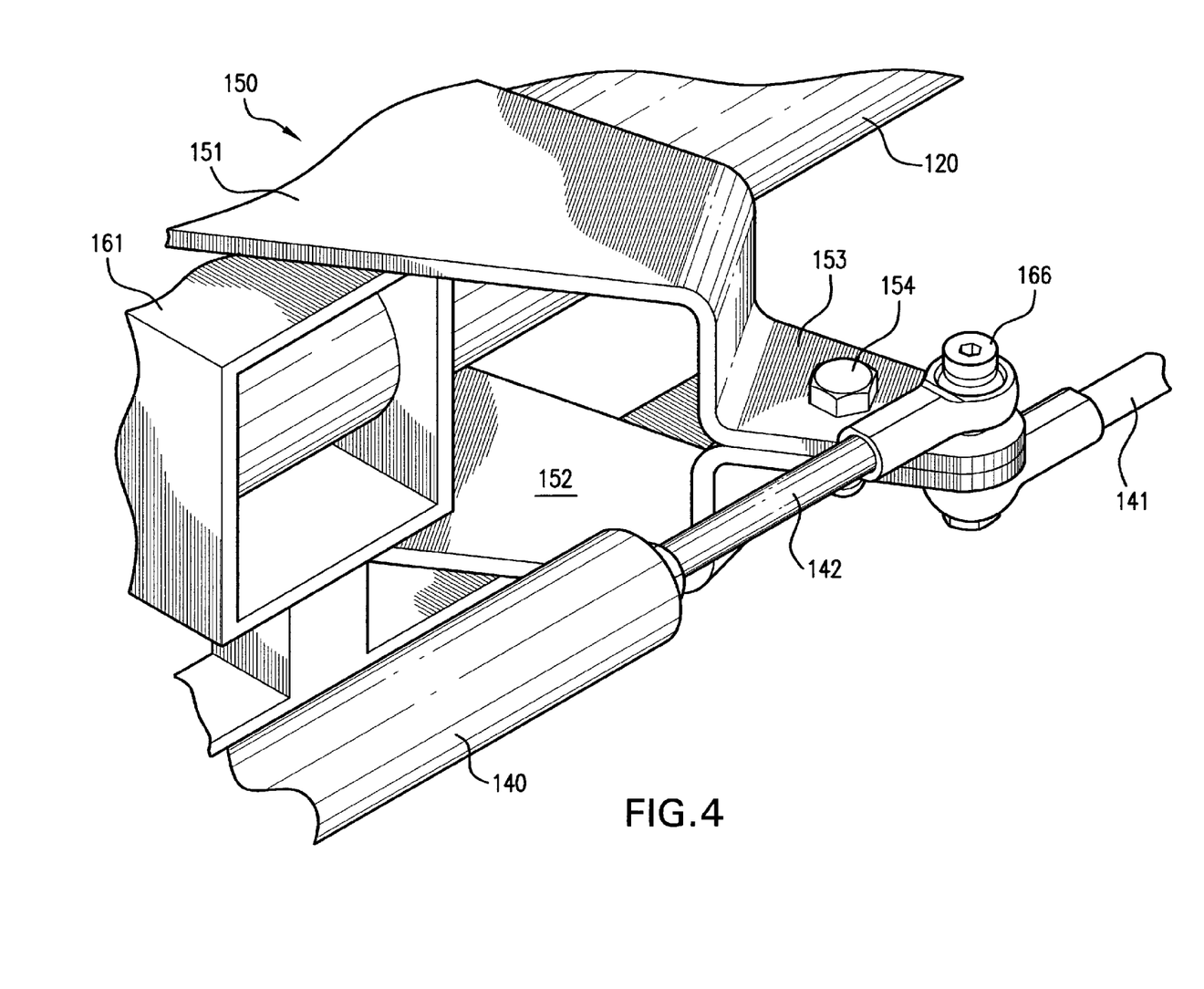
FIG. 4 is a partial perspective view of a linkage and a pivot coupling according to one embodiment.

A coupling 150 is attached to each mount 160 to enable the mount 160 and attached solar cell modules 200 to rotate about the second axis B. As illustrated in FIGS. 3 and 4, couplings 150 include first and second arms 151, 152 that are positioned on opposing sides of the base 161. The arms 151, 152 are each attached to the platform 164 at a first end, and are connected together at a neck 153 at an opposite second end. Arms 151, 152 may be constructed from separate pieces that are connected together with a fastener 154 that extends through the neck 153.

The couplings 150 are connected to the platforms 164 of the mounts 160. This connection causes the coupling 150 to rotate about the first axis A during rotation of the longitudinal support 120. Coupling 150 is also attached in a manner to rotate about the second axis B with the platforms 164. Because the arms 151, 152 are not connected to the base 161, the coupling 150 moves relative to the base 161 and longitudinal support 120 during rotation about the second axis B. In one embodiment, the arms 151, 152 are connected to the pivot member 165 that extends along a rear of the platforms 164.

Linkages 140 are connected to the mounts 160 for rotating the solar cell modules 200 about the second axes B. Each linkage 140 includes a first end 141 connected to a first coupling 150 and a second end 142 connected to an adjacent coupling 150. As best illustrated in FIG. 4, each coupling is attached to two separate linkages 140. The linkages 140 are attached together in a string that is aligned substantially parallel to the longitudinal support 120. The adjacent linkages 140 may be connected together by a common fastener 166 that extends through the neck 153 of the coupling 150.

Figure 2B:
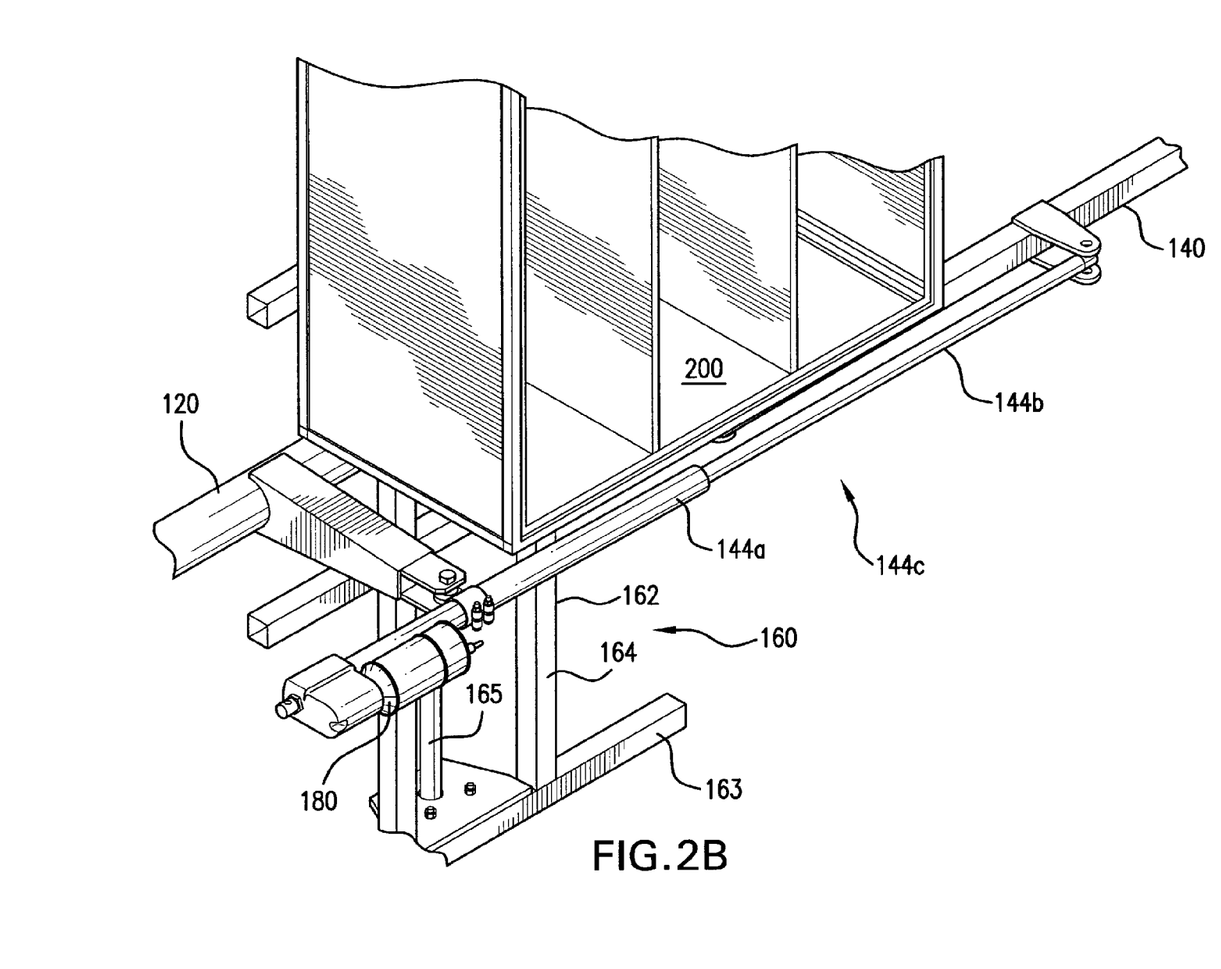
FIG. 2B is a partial perspective view of a mount connected to a longitudinal support and a motor operatively connected to the longitudinal support according to one embodiment.

A motor 180 is attached to a drive linkage 144 as illustrated in FIG. 2B. The drive linkage 144 includes a first section 144a and a telescoping second section 144b. The first section 144a is operatively connected to the motor 180, and the second section 144b is operatively connected to a linkage 140. The motor 180 provides a force for moving the drive linkage 144 and the attached linkages 140 and thus pivoting the solar cell modules 200 about the second axes B. The number of linkages 140 in the string that is moved by the motor 180 and the drive linkage 144 may vary depending upon the context of use. In one embodiment, a second motor 180 is positioned at a second end of the linkage string that works in combination with the motor 180 to move the linkages 140.

In one embodiment, the solar cell modules 200 are each about 43" by 67". The solar cell modules 200 include an aluminum frame and plastic or corrugated plastic sides that reduce the overall weight to about 70 pounds. In one embodiment, each solar cell module 200 includes a 3×5 array of lenses that are positioned over corresponding receivers. Each of the lenses is about 13" square. Further, the focal length between the lenses and the receivers is about 20".

When mounted on the surface 300, the longitudinal support 120 may be positioned in a north N-south S orientation as illustrated in FIG. 1. In one embodiment, the surface 300 is the surface of the Earth. The longitudinal support 120 includes a length to space a desired number of solar cell modules 120. Throughout the course of the day, the array 100 is adjusted to maintain the solar cell modules 200 facing towards the sun. The motor 170 may be periodically activated to provide a force to rotate the longitudinal support 120 and hence each of the mounts 160 and attached solar cell modules 200. The force applied by the motor 170 provides for each of the solar cells receivers 200 to be moved a same amount such that each solar cell array module 200 is synchronized and move in unison. Rotation of the longitudinal support 120 may provide for the solar cell modules 200 to track the elevation of the sun during the course of the day.

In addition to the rotation of the longitudinal support 120, the one or more motors 180 move the linkages 140 to further maintain the solar cell modules 200 aligned with the sun. The motor(s) 180 are periodically activated to move the first linkage 140a and attached string of linkages 140. This movement causes the couplings 150 and attached platforms 164 and solar cell modules 200 to pivot about the various axes B. These axes B may be orthogonal to the axis A. The string of linkages 140 provides for each of the solar cell modules 200 to again move in unison about their respective axis B. The movement about the B axes may allow the solar cell modules 200 to track the azimuthal position of the sun during the course of the day.

A controller 190 may control the movement of the terrestrial solar tracking array 100. The controller 190 may include a microcontroller with associated memory. In one embodiment, controller 190 includes a microprocessor, random access memory, read only memory, and in input/output interface. The controller 190 controls operation of the one or more motors 170 for rotating the longitudinal support 120 and the solar cell modules 200 about the first axis A. The controller 190 further controls the one or more motors 180 for driving the linkages 140 and rotating the solar cell modules about the second axes B. The controller 190 may include an internal timing mechanism such that the operation of the motors corresponds to the time of day for the solar cell modules 200 to track the azimuth and elevation of the sun.

The shadow cast by a given solar cell module 200 depends on its size and shape, and also on its location relative to the location of the sun in the sky. In the East-West direction, the sun location can vary by up to 150°. In this connection, it should be noted that it is generally accepted that, where the elevation of the sun is below 15° above the horizon, its rays are of insufficient strength to generate a useful amount of electricity. The latitude at which the solar cell array 100 is positioned is, therefore, of little influence.

In the North-South direction, the sun location varies by 46°, given that the earth's axis is tilted at an angle of 23° with respect to its orbit around the sun. In this connection, it will be appreciated that latitudes below 23° are subject to different conditions, and that latitudes above 45° are probably not relevant due to poor direct normal insolation (DNI) levels.

The solar cell array 100 is constructed in a manner to eliminate or minimize shadowing problems between solar cell modules 200. In one embodiment, the longitudinal support 120 and the individual sections 121 of the solar cell modules 200 are sized to space apart each module 200 such that it is fully illuminated for positions where the sun is 15° above the horizon, and that there is no shadowing of any given module 200 by any other module 200.

Figure 5:
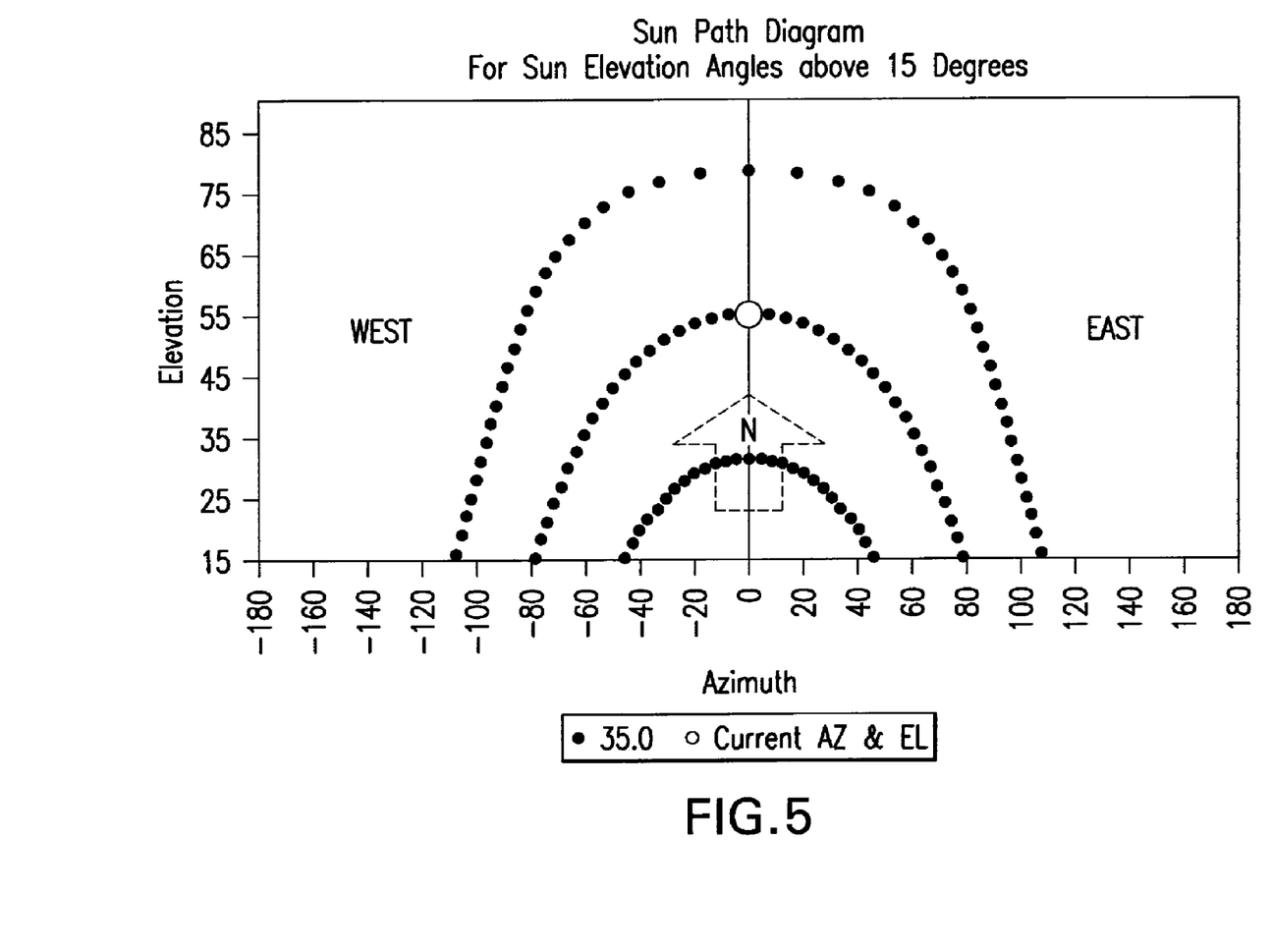
FIG. 5 is a graph illustrating the sun's path on the earth as a function of elevation and azimuth.

FIG. 5 is a sun path diagram showing the elevation of the sun for all angles above 15° at a latitude of 35° North. The graph shows the sun path for three times of the year, namely at the summer solstice (indicated by the highest dotted line), at the winter solstice (indicated by the lowest dotted line), and at the equinoxes (indicated by the middle dotted line). At all other dates, the sun path falls within the envelope defined by the highest and lowest dotted lines. Thus, at the winter solstice, the sun path goes from a negative azimuth angle of about 45° to a positive azimuth angle of about 45°, and from an elevation of 15° to about 27°, and then back to 15°. Similar ranges are apparent for a sun path at the summer solstice and at the equinoxes.

U.S. Pat. No. 7,381,886 assigned to Emcore Corporation the assignee of the present application discloses solar cell arrays and positioning relative to the sun path and is herein incorporated by reference in its entirety.

In one embodiment, the terrestrial solar tracking array 100 can be installed in a straight-forward manner. The various components are sized to fit within a standard vehicle and are light-weight to allow installation by a single person or limited number of persons. Further, the modular aspect of the array 100 facilitates modifications after the initial installation. Additional sections 121 and vertical supports 130 may be added to the frame 110 to accommodate a desired number of additional solar cell modules 200. Further, the size of the array 100 may be reduced after installation by removing one or more solar cell modules 200.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A terrestrial concentrator solar tracking photovoltaic array comprising:
   a longitudinal support extending over the surface of the earth and including a longitudinally-extending string of spaced apart concentrator solar cell modules mounted thereon, wherein each module is positioned on a mount and each module comprises a concentrating lens positioned over and spaced apart from corresponding receivers, said longitudinal support being journalled for rotation about a first axis so as to allow the modules to simultaneously track the sun about the first axis during the course of a day, wherein the first axis is collinear with said longitudinal support;
   a pivotable coupling between each of said mounts and said longitudinal support so as to allow each module to simultaneously rotate about its own second axis so as to allow the modules to track the sun about each respective second axis during the course of the day, wherein the second axes are substantially orthogonal to the first axis;
   a plurality of elongated linkages that each extend parallel to the longitudinal support, each of said elongated linkages connecting together adjacent mounts; and
   a linear actuator coupled to the linkages in a manner to move the linkages axially along the longitudinal support to rotate each mount.

2. The terrestrial solar tracking photovoltaic array of claim 1, wherein each of said mounts is attached to two of said elongated linkages.

3. The terrestrial solar tracking photovoltaic array of claim 1, wherein each of said mounts and each of said elongated linkages are configured to rotate about the longitudinal axis of said longitudinal support.

4. The terrestrial solar tracking photovoltaic array of claim 1, further comprising a plurality of vertical supports that each include a first end configured to contact against support surface and a second end operatively connected to the longitudinal support, each of said vertical supports being spaced away from each of said solar cell modules along the longitudinal support.

5. The terrestrial solar tracking photovoltaic array of claim 4, further comprising connectors on the second ends of said vertical supports that attach to the longitudinal support and allow for rotation of the longitudinal support about the longitudinal axis.

6. The terrestrial solar tracking photovoltaic array of claim 1, further comprising a motor operatively connected to the longitudinal support to rotate said longitudinal support about said longitudinal axis.

7. The terrestrial solar tracking photovoltaic array of claim 1, wherein the longitudinal support includes a pipe with a diameter of about 4 inches and a length of about 192 inches.

8. The terrestrial solar tracking photovoltaic array of claim 1, wherein the longitudinal support extends over the surface of the earth substantially in a north-south direction.

9. The terrestrial solar tracking photovoltaic array of claim 1, further comprising one or more motors operatively connected to the plurality of elongated linkages so that the linkages can be moved to simultaneously rotate each module about its own second axis.

10. A terrestrial concentrator solar tracking photovoltaic array comprising:
a longitudinal support;
a plurality of mounts connected to the longitudinal support and spaced apart along a length of the longitudinal support;
a concentrator solar cell array module connected to each of the plurality of mounts, wherein the module comprises a concentrating lens positioned over and spaced apart from corresponding receivers;
a string of linkages spaced apart from the longitudinal support and connecting together each of the plurality of mounts, each of the linkages including a discrete length to extend between adjacent mounts that are spaced apart along the length of the longitudinal support;
the longitudinal support being rotatable about a first axis to simultaneously move each of the solar cell modules within a first plane to track the sun about the first axis during the course of a day, wherein the first axis is collinear with said longitudinal support;
the string of linkages being movable axially along the longitudinal support to rotate each of the plurality of mounts and the connected solar cell modules about their own second axis and within second planes that are each orthogonal to the first plane to track the sun about the respective second axes during the course of the day; and
a linear actuator coupled to the string of linkages in a manner to move the linkages axially along the longitudinal support to rotate each of the plurality of mounts.

11. The terrestrial solar tracking photovoltaic array of claim 10, wherein the longitudinal support comprises a plurality of discrete sections that are attached together in an end-to-end arrangement.

12. The terrestrial solar tracking photovoltaic array of claim 11, wherein each discrete section includes one of said plurality of mounts.

13. The terrestrial solar tracking photovoltaic array of claim 11, wherein at least two of the plurality of discrete sections include different lengths.

14. The terrestrial solar tracking photovoltaic array of claim 11, wherein each mount includes first and second platforms that are each configured to receive one of the solar cell modules, the mounts attached to the longitudinal support such that the first platform is on a first side of the longitudinal support and the second platform is on an opposite second side of the longitudinal support.

15. The terrestrial solar tracking photovoltaic array of claim 10, further comprising a plurality of couplings connected to the longitudinal support, each of the plurality of couplings further attached to one of the plurality of mounts to connect the mount to the string of linkages.

16. The terrestrial solar tracking photovoltaic array of claim 10, further comprising a plurality of vertical supports that support the longitudinal support above the surface of the earth, each of the plurality of vertical supports spaced away from the plurality of mounts along the length of the longitudinal support.

17. The terrestrial solar tracking photovoltaic array of claim 16, wherein the longitudinal support includes a pipe with a diameter of about 4 inches and a length of about 192 inches, and the plurality of vertical supports include a rectangular shape of about 4 inches by about 4 inches.

18. The terrestrial solar tracking photovoltaic array of claim 10, further comprising a controller operatively connected to the longitudinal support to control rotation of the longitudinal support about the first axis and the axial movement of the string of linkages.

* * * * *